United States Patent [19]
Rivera

[11] Patent Number: 6,130,377
[45] Date of Patent: Oct. 10, 2000

[54] THERMOELECTRIC BATTERY AND POWER PLANT USING THE SAME

[75] Inventor: Carlos Avila Rivera, P.O. Box 14, Angeles, Puerto Rico 00611

[73] Assignee: Carlos Avila Rivera, Angeles, Puerto Rico

[21] Appl. No.: 09/009,553

[22] Filed: Jan. 20, 1998

[51] Int. Cl.[7] .................................................. H01L 35/00
[52] U.S. Cl. ........................ 136/206; 136/208; 136/209; 136/230
[58] Field of Search .................................. 136/205, 206, 136/209, 225, 230, 243, 251, 208

[56] References Cited

U.S. PATENT DOCUMENTS 4,284,838   8/1981   Indech ...................................... 136/205

*Primary Examiner*—Kathryn Gorgos
*Assistant Examiner*—Thomas H. Parsons

[57] ABSTRACT

A thermoelectric battery is disclosed which uses pipes connected in series made from two different metallic materials. The pipes are connected in an alternating manner and exposed to sunlight to increase the temperature therein. Other parts of the pipes are connected to a cooler temperature such as water or the ground to produce a temperature differential suitable to produce a voltage potential. The thermoelectric battery is also used to supply power to a swinging pendulum in which two different ionic chemicals are mixed at a selected time to generate electrical power. The thermoelectric battery, connected through a pacemaker circuit, produces a magnetic field at predetermined periods equal to a multiple of the period of oscillation of the pendulum, the field acting to give the pendulum a push in order to keep the pendulum from stopping.

7 Claims, 3 Drawing Sheets

THERMOELECTRIC BATTERY AND POWER PLANT USING THE SAME

BACKGROUND OF THE INVENTION.

1. Field of the Invention.

The present invention relates to a thermoelectric battery which produces an electrical charge from sunlight, and a power system which produces an electric current or potential from stored chemical energy in which the thermoelectric battery provides energy to make up for losses therein.

2. Background of the Prior Art

SUMMARY OF THE INVENTION

The thermoelectric battery of the present invention makes use of dissimilar metals or metal alloys connected in series in an alternating manner to produce an electrical current when the dissimilar metals or metal alloys are exposed to a high temperature such as that produced by direct sunlight. The dissimilar metals or metal alloys of the battery can be flat plates made of copper and aluminum and separated by a nickel plate, or can be a series of copper and iron pipes connected in an alternating series. The thermoelectric battery is partially submerged in a water tank or in the ground to maintain the ends of the plates or pipes in a lower temperature than the plate or pipe section exposed to the sunlight. Adjacent pipe sections are connected together by a wire to maintain the series linkage.

The power system of the present invention uses a thermoelectric battery to provide make-up power to overcome frictional losses in the power system. The power system includes a pendulum device having a sphere filled with an ionic chemical mixture separated by a vegetable membrane. The ionic compound can be vinegar and water, a mixture of 20% sodium and 20% calcium and 60% chlorine, or other well known ionic compounds. Movement of the pendulum causes an agitation of the ionic mixture, which then produces electrical power to charge an external capacitor. The thermoelectric battery is used to supply electrical current to a pacemaker circuit, which then supplies pulses of electrical power to a magnetic field generating device which produces a "kick" to maintain the pendulum in a swinging manner. At the top of the pendulum is located a permanent magnet. Adjacent to the permanent magnetic is a bar magnet surrounded by a wire coil connected to the pacemaker circuit. When the pacemaker circuit produces a pulse of electrical current, the coil produces a magnetic field in the bar magnet, and the resulting magnetic field is used to push and/or pull (the "kick") on the permanent magnetic attached to the pendulum to add energy to the swinging pendulum.

DETAILED DESCRIPTION

Figure 1:
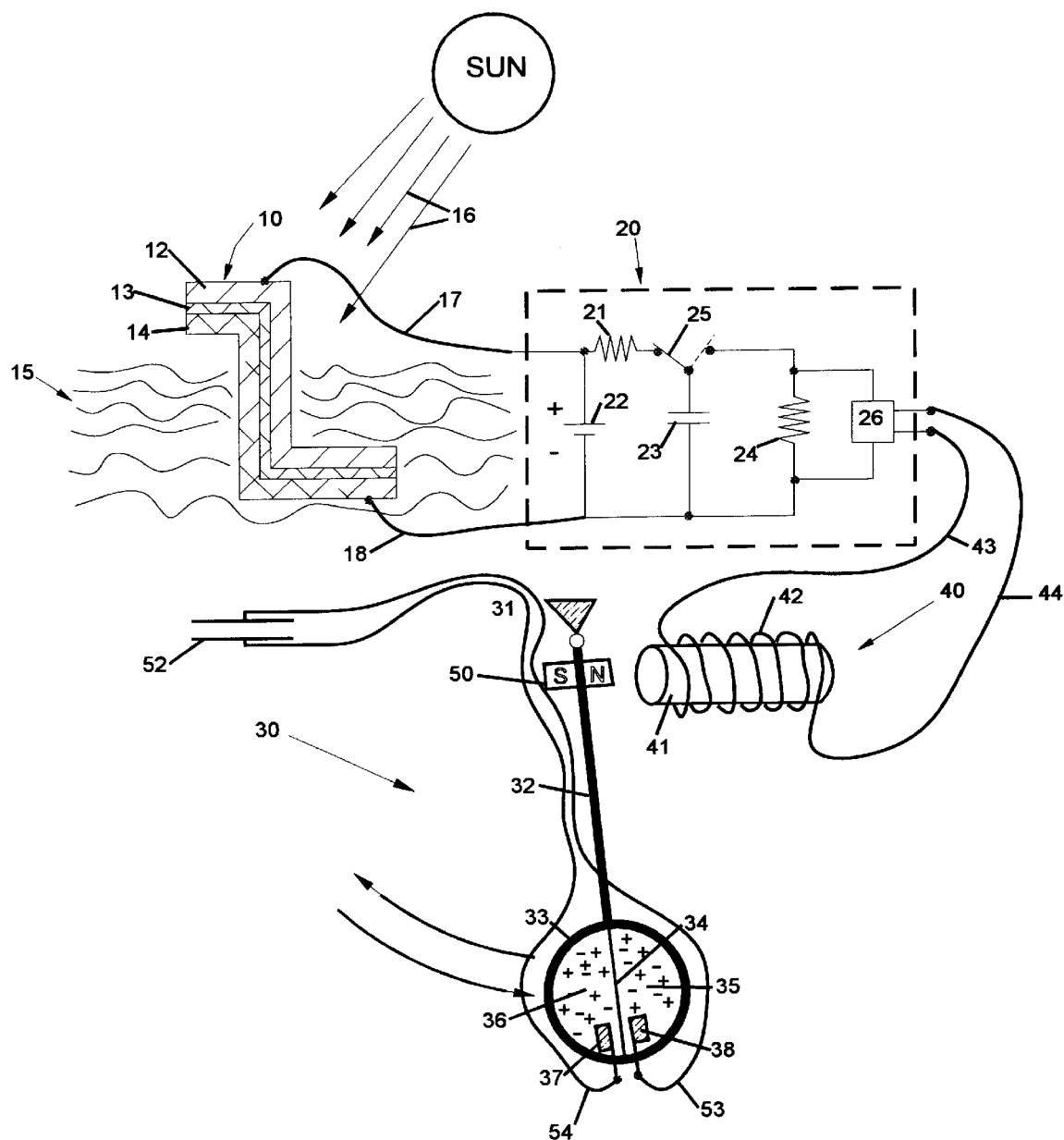
FIG. 1 shows the pendulum power system using the thermoelectric battery, the pacemaker circuit, and the pendulum with the ionic chemical mixture.

The power system of the present invention is shown in FIG. 1. A thermoelectric battery 10 is partially submerged in a body of water 15. The thermoelectric battery includes a copper plate 12 and an aluminum plate 14 separated by an electrically conductive plate 13 made of nickel. The nickel plate 13 binds the two outer plates 12 and 14 together. The nickel plate could be made of other materials that have high electrical conductivity. Electrical conducting wires 17 and 18 are connected the respective plates 12 and 14 to a pacemaker circuit 20. The thermoelectric battery 10 can be partially submerged halfway in fresh water or salt water, or can be partially submerged underground halfway. The size of the plates of the thermoelectric battery 10 would depend on the amount of electric power needed for the pacemaker circuit 20 and the pendulum 30.

The pacemaker circuit 20 includes a 6-volt battery 22, a first resistor 21, a switch 25, a capacitor 23, a second resistor 24, and a transformer 26. The pacemaker circuit 20 makes use of the electrical energy stored in the internal battery 22 and the electrical energy supplied by the thermoelectric battery 10 to charge the capacitor 23. The internal battery 22 would supply the pacemaker circuit with the necessary electrical power to charge the capacitor 23 when the thermoelectric battery 10 is producing less electrical power than usual such as when a cloud blocks the sunlight 16. When a charge on the capacitor reaches a predetermined electrical potential, the built-up charge in the capacitor 23 is released into the transformer 26 and an electrical current is released through wires 43 and 44. The charge in the capacitor 23 is released when the switch 25 is moved to the right side position in FIG. 1. The switch is a well known self-acting switch that moves to the discharge position when a certain potential voltage is reached, and returns to the charge position when the voltage drops below a certain level. The values for the battery, resistors, capacitor and transformer can vary depending on the characteristics of the pendulum (which is described below).

The output of the pacemaker circuit 20 is connected by the wires 43 and 44 to a bar magnet 41. The bar is approximately 1 inch in diameter and 12 inches in length. The wires 43 and 44 coil around the bar magnet 41 a number of times to form an impulse device 40 for generating a timed pulse (force) or "kick" that acts on the swinging pendulum at specified points in the motion of the pendulum in order to keep the pendulum swinging. The number of coils 42 would depend upon the amount of magnetic field to be generated by the bar magnet. When a current from the pacemaker circuit 20 is induced in the wires 43 and 44, a magnetic field is generated by the coils 42 and the bar magnet 41. The resulting magnetic field generated is used to apply a pushing or pulling force on a magnet 50 located near the top of a pendulum 30. The direction of the current generated in the wires 43 and 44 would determine in which direction the magnetic force generated in the coils 42 would act. To produce the correct direction of force, the wires 43 and 44 could be reversed in their connection to the pacemaker circuit 20, or the magnet 50 on the pendulum 30 could be turned so that the other pole faces the bar magnet 41.

The electrical parts of the pacemaker circuit 20 can be chosen such that the natural frequency at which the pacemaker circuit discharges would be synchronized with the natural frequency of the swinging pendulum. Another embodiment would provide a sensor (not shown) near the pendulum 30 to determine when the pendulum 30 is in a certain position. When the pendulum is in a certain position—such as all the way to the right in FIG. 1—a control system (not shown) connected to the sensor would allow discharge of the pacemaker circuit 20 to provide the electrical current to the wires 43 and 44 to produce the "kick" in a timed relation to the motion of the pendulum 30.

The pendulum 30 includes a hollow sphere 33 made of an electrically conductive material such as aluminum having a diameter in this embodiment of about 1 ½ feet. A pendulum arm 32 connects the sphere 33 to a fixed pivot point 31. The length of the entire pendulum in the preferred embodiment is about 70 feet. Inside the hollow sphere 33 is a non-conductive insulator 34 dividing the hollow sphere into two equal volumes 35 and 36. The insulator 34 can be a vegetable membrane. Inside the hollow sphere are chemical ionic substances, which function as an electrochemical battery to generate an electric current. The chemical ionic substances could be a mixture of 5% to 10% water and the rest vinegar, or a mixture of 20% sodium, 20% potassium and 60% chlorine. The ionic compound is placed in both halves of the sphere 32 in equal proportions. Movement of the sphere causes the ionic chemicals to agitate. The ionic mixture includes compounds of different charges. In the water and vinegar mixture, the vinegar includes an OH compound having a negative charge. The smallest ion will pass through the membrane 34. This flow of charged ions through the membrane 34 would result in a voltage potential being established within the hollow sphere. Also located in the sphere are two metallic electrodes 37 and 38. One electrode 37 is made of gold while the other electrode 38 is made of silver. Other materials could be aluminum and iron. The electrodes 37 and 38 carry an electric current developed by the ionic chemicals in the sphere 33 through wires 53 and 54 to a capacitor 52. A voltage is developed in the capacitor 52, which can be used for electrical power.

In order for the timed pulses from the pacemaker circuit 20 to be effective in maintaining the swinging motion of the pendulum 30, the values of the resistors 21 and 24 and capacitor 23 must be related to the length of the pendulum. The frequency of the pacemaker circuit must be equal to or proportional to the natural frequency of the pendulum. The voltage in the capacitor 23 is $V_c = \epsilon(1-e^{-t/RC})$ where $\epsilon$ is the voltage in the battery 22, R is the value of the resistor 21, and C is the value of the capacitor 23. The thermoelectric battery 10 is required to provide at least 120 volts of electrical power to the pacemaker circuit 20. For the pulsed force applied to the pendulum 30 to be effective, $\tau_c = 100 * \tau_p$ or the characteristic time constant of the pacemaker circuit 20 should be 100 times the value of the period of oscillation of the pendulum. When this occurs, the voltage in the capacitor 23 will be $0.63\epsilon$ or 75.6 volts. Letting the value of the capacitor 23 to be 100 micro-farads, and the length of the pendulum is 70 feet (or 21.34 meters), the value for the resistor 21 becomes R=9,267,000 ohms. The discharge of the pacemaker circuit 20 will occur when the switch 25 is in the left side position of FIG. 1, which is after 100 oscillations of the pendulum. Since $V_c = V_{MAX} * e^{-t/rC}$ and $I = V_{MAX}/r * e^{-t/rC}$, and if $I_0=10$ amps, then r=75.6 volts/10 amps or 7.56 ohms. The resistor 24 is r=7.56 ohms. Then, the discharge time of the pacemaker circuit 20 is $\tau = rC = 0.000756$ seconds or about 1 micro-second.

When the stored chemical energy in the ionic compound is used up, the mixture in the sphere 33 is replaced with a new mixture for the next operation of the pendulum system.

Figure 2:
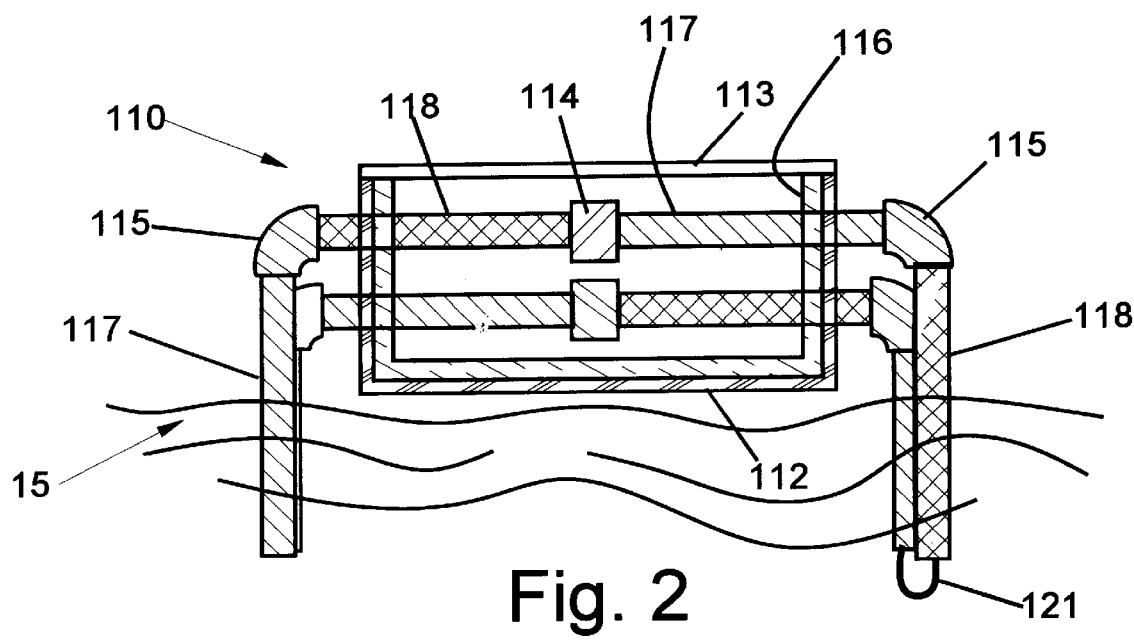
FIG. 2 shows a side view of a thermoelectric battery using a series arrangement of two different metal pipes connected in an alternating manner.

FIG. 2 shows another embodiment of the thermoelectric battery 110 used to convert sunlight into electrical power. The thermoelectric battery 110 includes a series of galvanized iron pipes 117 and copper pipes 118 arranged in an alternating pattern. The pipes are connected together in the middle of a sunlight accumulation tank by a metal joiner 114 such as a metal tube. The metal tube could be made from the same material in which one of the pipes 117 or 118 is made from. Two pipes can be connected to the connector 114 by welds or threads cut into the connector 114 and the pipes 117 and 118. Outside the accumulation tank 110, the pipes are connected together by elbow joints 115. The accumulation has a Plexiglas layer 112 for structural support, and an insulation layer of Styrofoam 116. Covering the top of the accumulation tank is a glass pane or window 113. The window allows the sunlight to pass into the interior of the accumulation tank but does not allow the ultraviolet energy to escape (the greenhouse effect). The rise in temperature inside the accumulation tank heats up the pipes and produces the desired electrical voltage and current in the series of pipes. The outside ends of the pipes are buried into the ground 15 or submerged halfway into a body of water to cool the ends of the pipes in relation to the pipes inside the accumulation tank. The series of pipes are connected together by wires 121 such that an alternating series of pipes in formed (as in FIG. 4). The first and last pipes in the alternating series would be connected to the wires 17 and 18 leading to the pacemaker circuit 20.

Figure 3:
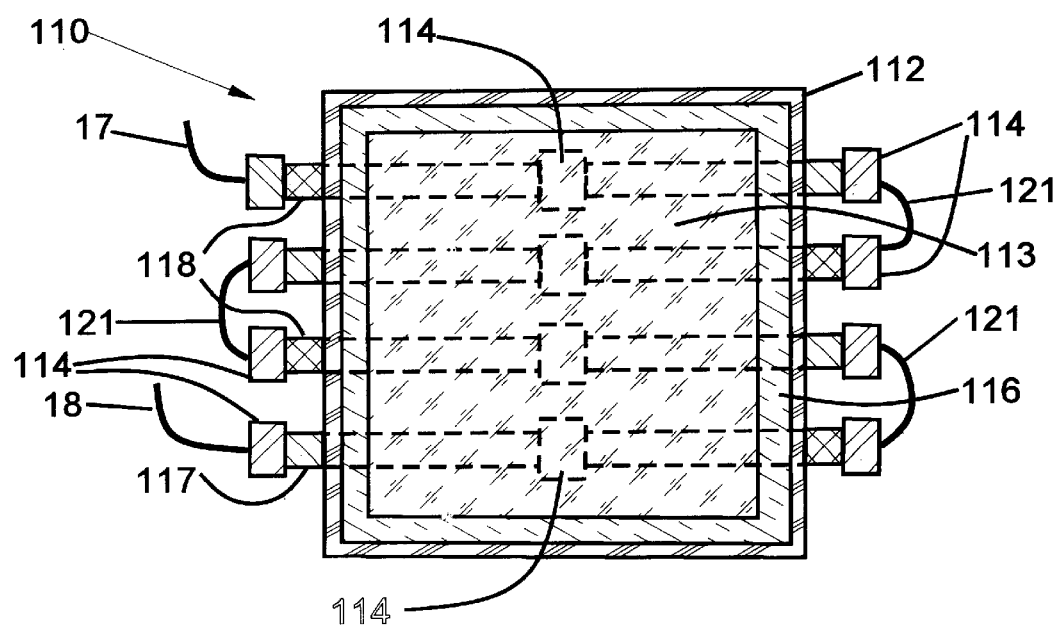
FIG. 3 shows another arrangement for connecting a series of two different metal pipes in an alternating manner.
Figure 4:
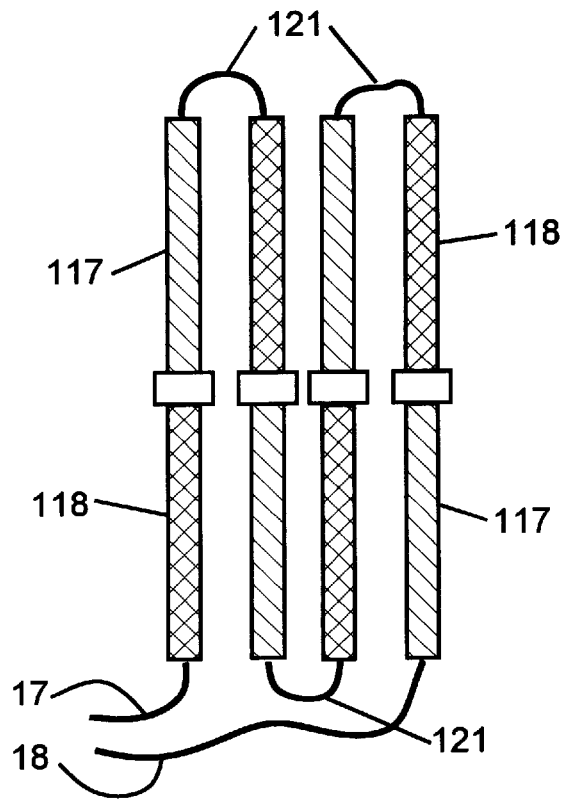
FIG. 4 shows the pipe connections of the battery in FIG. 3.
Figure 5:
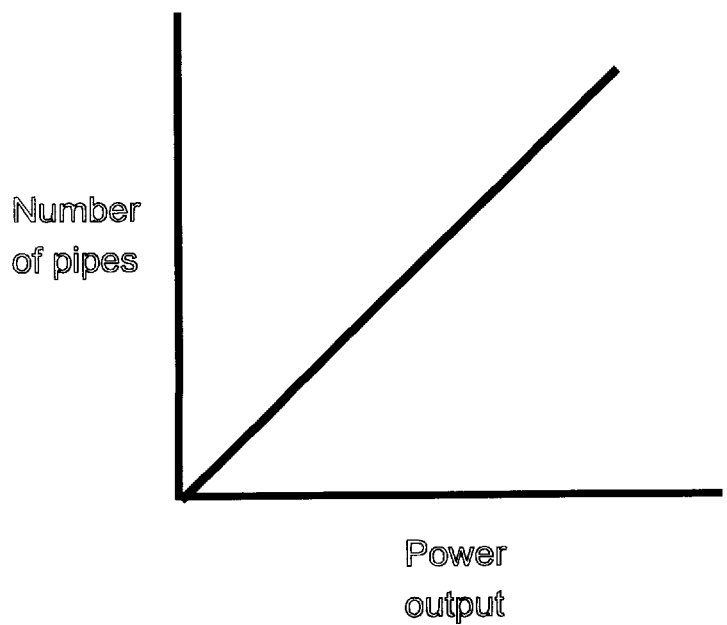
FIG. 5 shows a graph of the relationship between the number of pipes used in the thermoelectric battery and the current or electrical power generated by the battery.

FIG. 3 shows another embodiment of the thermoelectric battery 110 in which a series of pipes are connected together. The galvanized iron pipes 117 and copper pipes 118 arranged in an alternating pattern and together inside the accumulation tank by the connectors 114. Outside the accumulation tank the pipes are connected together in the alternating pattern by wires 121. Also, the pipe sections extending on the outside of the accumulation tank would be submerged in water or placed in the ground to maintain the outside ends of the pipes at a lower temperature to that inside the accumulation tank. FIG. 4 shows the alternating pipe connection arrangement. The ends of the series of pipes are connected to the pacemaker circuit by wires 17 and 18. As shown in FIG. 5, increasing the number of pipes produces a linear increase in the power supplied by the pipe arrangement.

In order for the thermoelectric battery of the present invention to produce the largest amount of power, the pipes inside the accumulation tank should be as hot as possible while the ends of the pipes outside the acccumulation tank should be as cold as possible.

The use of the thermoelectric battery and the pendulum system will now be described. The two halves 35 and 36 of the hollow sphere 33 are first filled with the desired ionic chemical compounds. If the water and vinegar mixture is desired, a fully mixed solution of the vinegar and water are placed in both halves in equal proportions. The pendulum 30 is manually positioned at an angle of about 30 degrees off center and held by a latch (not shown) or the like until ready for release. While the pendulum 30 is in this positive potential energy state, the thermoelectric battery 10 is collecting sunlight 16 and producing electrical power. The electric power is delivered through wires 17 and 18 to the pacemaker circuit 20, which charges the capacitor 23 while the switch 25 is in the left side or charge position. The electrical output of the thermoelectric battery 10 is also used to supply power to a user (not shown). Under low load situations, the power supplied by the thermoelectric battery 10 would be enough to power the user. In the situation where the supplied power is not enough—such as in high demands or a loss of sunlight—the pendulum can be released to produce the required agitation of the ionic chemicals and thus the electrical power therefrom. As the pendulum is swinging, the pacemaker circuit—in synchronized operation with the pendulum—will provide an electrical current or pulse to the wire coils 42 around the bar 41 such that a magnetic field is generated. The magnetic field will produce an impulse force (the "kick") on the magnet 50 connected to the pendulum arm 32 and thus add enough energy to the swinging pendulum to make up for the normal losses therein to keep the pendulum swinging. The power developed in the ionic chemicals in the hollow sphere 33 can be used to charge a capacitor 52 or used to supply power to the user of the thermoelectric battery 10. When the ionic chemicals have been fully used up and no more electrical power is generated in the sphere, the used chemicals can be drained and the sphere refilled. The pendulum is then positioned at about 30 degrees and locked in place awaiting another instance when the potential energy of the pendulum is required.

The bar magnet 40 and pacemaker circuit 20 can supply the "kick" to the pendulum 30 after 100 cycles of the pendulum 30, or any other number of cycles depending on the amount of energy the pendulum losses during its swinging motion. The purpose of the "kick" is to make up for losses in the movement of the pendulum. Also, the timing of the pacemaker circuit 20 can be done through a position sensor and capacitor 23 discharge system that will detect a predefined number of oscillations of the pendulum and the proper position of the pendulum before releasing the "kick".

I claim:

1. A thermoelectric battery, comprising;

a container;

a first pipe made from a first metal or alloy;

a second pipe made from a second metal or alloy;

a first end of the first pipe connected to a first end of the second pipe through a connector;

a third pipe made from the second metal or alloy;

a fourth pipe made from the first metal or alloy;

a first end of the third pipe connected to a first end of the fourth pipe through a connector;

the second end of the first pipe connected to the second end of the third pipe by an electrically conductive member;

the second end of the second pipe connected to a first electrical wire lead, and the second end of the fourth pipe connected to a second electrical wire lead;

the second ends of the first, second, third, and fourth pipes extending out of the container such that a substantially large portion of the pipes are exposed within the container; and, a glass piece covering one side of the container such that light can pass into the container.

2. The thermoelectric battery of claim 1, and further comprising;

the first metal or alloy being galvanized iron; and, the second metal or alloy being copper.

3. The thermoelectric battery of claim 1, and further comprising;

the pipes are arranged in parallel.

4. A thermoelectric battery, comprising;

a container;

a first pipe made from a first metal or alloy;

a second pipe made from a second metal or alloy;

a first end of the first pipe connected to a first end of the second pipe through a connector;

a third pipe made from the second metal or alloy, a first end of the third pipe connected to the second end of the first pipe by an elbow connector;

a fourth pipe made from the first metal or alloy, a first end of the fourth pipe connected to the second end of the second pipe by an elbow connector;

a first end of the first pipe connected to a first electrical wire, and the first end of the fourth pipe connected to a second electrical wire;

the second ends of the first and second pipes extending outside of the container; and, a glass plate secured on one side of the container such that sunlight can pass through the glass plate and into the container.

5. The thermoelectric battery of claim 4, and further comprising:

the first metal or alloy being galvanized iron; and, the second metal or alloy being copper.

6. The thermoelectric battery of claim 4, and further comprising:

the third and fourth pipes extend from the respective connectors in direction substantially normal to an inside surface of the glass plate.

7. The thermoelectric battery of claim 4, and further comprising:

the container is box-shaped.

* * * * *